United States Patent
Ueki

(10) Patent No.: US 6,254,690 B1
(45) Date of Patent: Jul. 3, 2001

(54) SEMICONDUCTOR WAFER CLEANING METHOD USING A SEMICONDUCTOR WAFER CLEANING DEVICE THAT SUPPORTS A LOWER SURFACE OF THE WAFER

(75) Inventor: Koji Ueki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/276,796

(22) Filed: Mar. 26, 1999

(30) Foreign Application Priority Data

Apr. 7, 1998 (JP) .................................................. 10-094231

(51) Int. Cl.[7] ............................. B08B 1/00; B08B 3/08; B08B 5/00; B08B 11/02
(52) U.S. Cl. .................. 134/6; 134/2; 134/3; 134/18; 134/21; 134/153; 134/902; 15/77; 15/88.2
(58) Field of Search ............................. 134/2, 3, 18, 6, 134/153, 902, 21; 15/77, 88.2, 88.3, 102

(56) References Cited

U.S. PATENT DOCUMENTS

| | | | |
|---|---|---|---|
| 5,651,160 | * 7/1997 | Yonemizu et al. | 15/302 |
| 5,860,178 | * 1/1999 | Nishimura et al. | 15/77 |
| 5,882,426 | * 3/1999 | Yonemizu et al. | 134/6 |
| 5,927,305 | * 7/1999 | Shiba | 134/153 |
| 5,964,954 | * 10/1999 | Matsukawa et al. | 134/6 |

FOREIGN PATENT DOCUMENTS

| | | |
|---|---|---|
| 1-184831 | 7/1989 | (JP) . |
| 4-94537 | 3/1992 | (JP) . |
| 5-3184 | 1/1993 | (JP) . |
| 7-169732 | 7/1995 | (JP) . |
| 8-71519 | 3/1996 | (JP) . |

* cited by examiner

Primary Examiner—Zeinab El-Arini
(74) Attorney, Agent, or Firm—Rabin & Champagne, P.C.

(57) ABSTRACT

Disclosed herein is a semiconductor wafer cleaning method using a semiconductor wafer cleaning device. The method includes providing a semiconductor wafer cleaning device with a back brush, bringing the back brush into contact with the entire lower surface of the semiconductor wafer, and cleaning an upper surface of the semiconductor wafer with a surface brush so as to clean the entire surface of the semiconductor wafer in an ever-horizontal state.

13 Claims, 2 Drawing Sheets

FIG. 3A
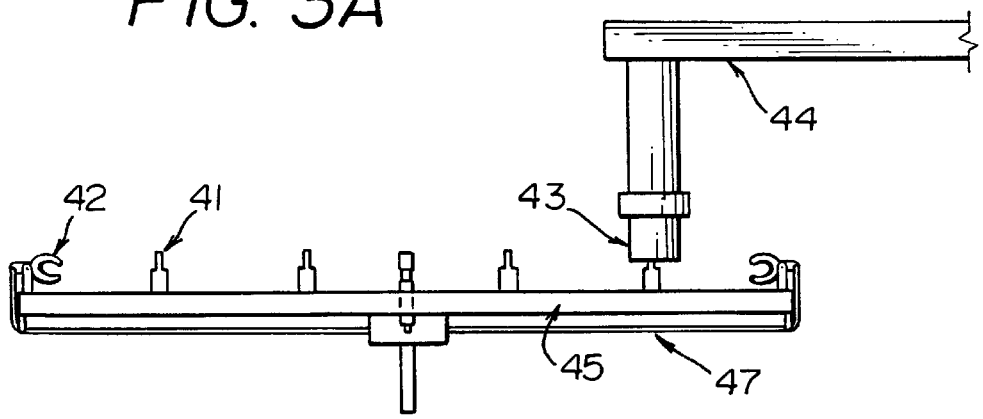
FIG. 3B
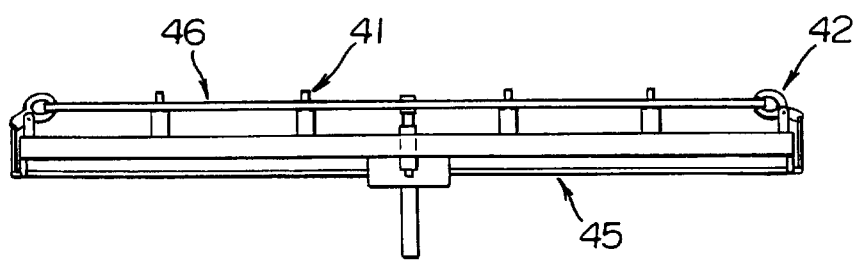
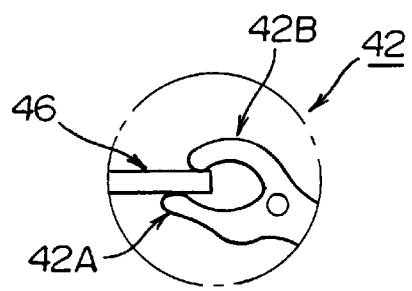
FIG. 3C

SEMICONDUCTOR WAFER CLEANING METHOD USING A SEMICONDUCTOR WAFER CLEANING DEVICE THAT SUPPORTS A LOWER SURFACE OF THE WAFER

BACKGROUND OF THE INVENTION

1. Field of the Invention

This invention relates to a device for cleaning a semiconductor wafer in the overall semiconductor process, and a method of cleaning the semiconductor wafer, using the device.

2. Description of the Related Art

As a device for and a method of cleaning a semiconductor wafer, a device for and a method of cleaning both surfaces of a semiconductor wafer have been proposed as disclosed in Japanese Patent Application Laid-Open. Nos. Hei 1-184831, 4-94537, 5-3184, 7-169732 and 8-71519.

SUMMARY OF THE INVENTION

An object of the present invention is to provide a semiconductor wafer cleaning device capable of accurately holding even a large-diameter semiconductor wafer in a horizontal state and reliably effecting a process such as cleaning or the like thereon, and a semiconductor wafer cleaning method using the semiconductor wafer cleaning device.

According to one aspect of this invention, for achieving the above object, there is provided a semiconductor wafer cleaning device, comprising:

first cleaning means for holding a semiconductor wafer in a horizontal state and contacting the entire lower surface of the semiconductor wafer; and second cleaning means for cleaning an upper surface of the semiconductor wafer.

According to another aspect of this invention, there is provided a method of cleaning a semiconductor wafer, comprising the following step:

a step for supporting the semiconductor wafer from a lower surface thereof so as to keep the same in a horizontal state and cleaning the lower surface of the semiconductor wafer and an upper surface thereof while the semiconductor wafer is being kept in the horizontal state.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3A is a cross-sectional view of a semiconductor wafer cleaning device depicting a third embodiment of the present invention;

FIG. 3B is a cross-sectional view of the semiconductor wafer cleaning device shown in FIG. 3A, which holds a semiconductor wafer thereon; and FIG. 3C is an enlarged view of means for holding the semiconductor wafer placed on the semiconductor wafer cleaning device shown in FIG. 3A.

DETAILED DESCRIPTION OF THE PREFERRED EMBODIMENTS

Preferred embodiments of the present invention will hereinafter be described in detail with reference to the accompanying drawings.

Figure 1:
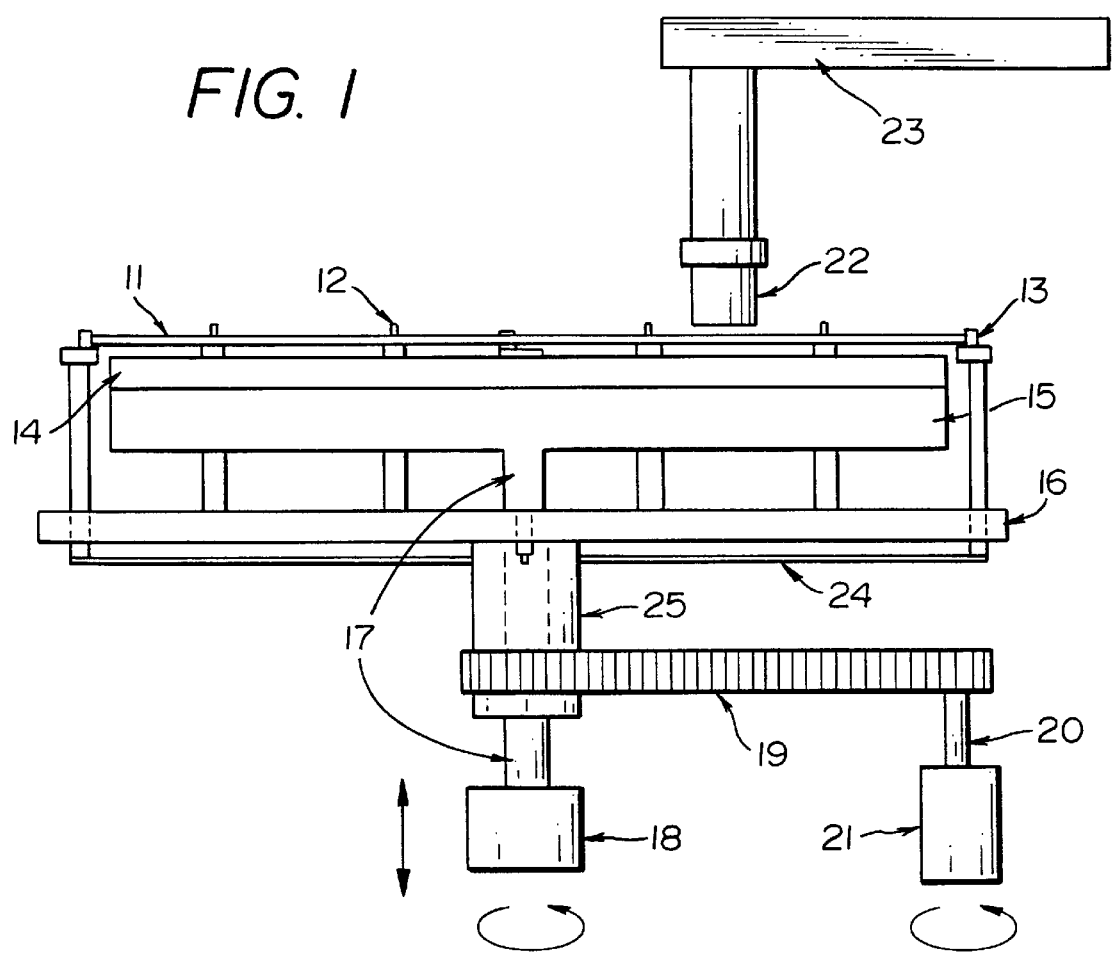
FIG. 1 is a cross-sectional view of a semiconductor wafer cleaning device showing a first embodiment of the present invention.

FIG. 1 is a cross-sectional view of a semiconductor wafer cleaning device showing a first embodiment of the present invention.

In FIG. 1, reference numerals 11, 12, 13, 14, 15, 16, 17, 18, 19, 20, 21, 22, 23, 24 and 25 indicate a semiconductor wafer, support pins, holding pins, a back brush which is brought into contact with the entire back of the semiconductor wafer 11, a brush body, a chuck base, a shaft for the back brush, a motor for the back brush, a chuck-rotating belt, a shaft, a chuck-rotating motor, a surface brush, a brush arm, an arm for the holding pins, and a chuck shaft, respectively.

As shown in the present drawing, the chuck base 16 is provided with the support pins 12 and the holding pins 13. The holding pins 13 are connected to the chuck-rotating belt 19 through the chuck shaft 25. Further, the holding pins 13 are connected to the chuck-rotating motor 21 through the shaft 20. The brush shaft 17 coupled to the motor 18 passes through a through portion lying in the center of the chuck shaft 25 and is connected to the back of the brush body 15. The back brush 14 is provided over the brush body 15. The reverse side of the brush body 15 and the back brush 14 are respectively shaped in the form of a circle substantially identical in size (surface area) to the semiconductor wafer 11. Further, the arm 24 is connected to the holding pins 13.

A method of cleaning a semiconductor wafer, using a semiconductor wafer cleaning device according to the first embodiment will next be explained.

Referring to FIG. 1, the semiconductor wafer 11 is placed on the support pins 12. The arm 24 used for the holding pins 13 is driven by an air cylinder to move the holding pins 13, so that the semiconductor wafer 11 is fixed. The chuck-rotating motor 21 rotates the chuck base 16 with the semiconductor wafer 11 placed thereon, through the shaft 20 and the chuck-rotating belt 19.

Next, the brush arm 23 and the surface brush 22 are shifted to the surface of the semiconductor wafer 11 to start its cleaning. Simultaneously, the brush body 15 and the back brush 14 are rotated via the brush shaft 17 by the motor 18 and thereafter move up to the height of the back of the semiconductor wafer 11 under the action of the air cylinder to start the cleaning of both surfaces of the semiconductor wafer 11 simultaneously.

According to the first embodiment as described above, since the brush is brought into contact with the flexed entire reverse side of a 300-mm semiconductor wafer and supports the entire back thereof, the entire surface of the semiconductor wafer is kept in a substantially horizontal state, so that the semiconductor wafer can be washed uniformly.

Since both surfaces of the semiconductor wafer are cleaned simultaneously as distinct from one-side separate cleaning, the cleaning device can be reduced in size and an improvement in throughput can be achieved.

A second embodiment of the present invention will next be described.

Figure 2:
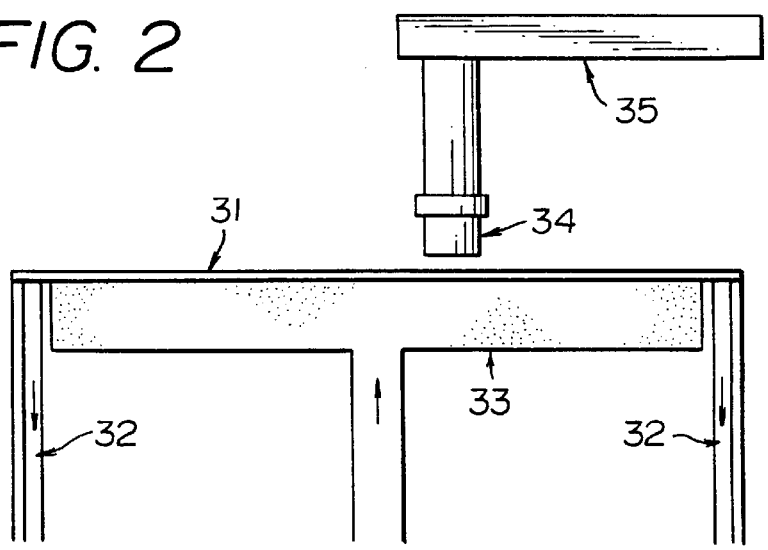
FIG. 2 is a cross-sectional view of a semiconductor wafer cleaning device illustrating a second embodiment of the present invention.

FIG. 2 is a cross-sectional view of a semiconductor wafer cleaning device showing the second embodiment of the present invention.

In the same drawing, reference numerals 31, 32 and 33 indicate a semiconductor wafer, a vacuum chuck, and a purge chamber, respectively. This purge chamber is filled with fluid (liquid or gas). Reference numerals 34 and 35 indicate a surface brush and a brush arm respectively.

As shown in FIG. 2, a peripheral portion of the semiconductor wafer 31 is vacuum-chucked by about 5 mm by the vacuum chuck 32. At this time, pressure applied to the upper surface of the semiconductor wafer 31 by the brush 34 is controlled so as to be substantially equal to that applied to the lower surface of the semiconductor wafer 31 by fluid. Thus, the semiconductor wafer 31 is no longer flexed.

Supporting the entire lower surface of the semiconductor wafer by fluid (liquid or gas) prevents "flexion" resulting from the weight of the semiconductor wafer itself.

Next, the semiconductor wafer is brushed from the upper surface thereof so as not to warp from the lower surface of the semiconductor wafer under the pressure of liquid or gas. Thereupon, the pressure of fluid is adjusted so that the semiconductor wafer can be always prevented from warping, i.e., the flatness of the semiconductor wafer can be made extremely satisfactory.

If a liquid or gas having cleaning action is used as the liquid or gas charged into the purge chamber 33, then the lower surface of the semiconductor wafer can be washed while satisfactorily keeping the flatness of the semiconductor wafer. The gas or liquid having the cleaning action may include, for example, sulfuric acid ($H_2SO_4$), ammonifying water, or water including a surface-active agent, etc.

A third embodiment of the present invention will next be explained.

FIG. 3A is a cross-sectional view of a semiconductor wafer cleaning device showing the third embodiment of the present invention, FIG. 3B is a cross-sectional view of the semiconductor wafer cleaning device holding a semiconductor wafer thereon, and FIG. 3C is an enlarged view of means for holding the semiconductor wafer placed on the semiconductor wafer cleaning device, respectively.

In these drawings, reference numerals 41 and 42 indicate support pins and holding pins respectively. Each of the holding pins 42 has a first supporter 42A brought into contact with a more-inwardly extending portion of the lower surface of the semiconductor wafer, and a second supporter 42B brought into contact with a more-outwardly extending portion of the upper surface of the semiconductor wafer. Reference numerals 43, 44, 45, 46 and 47 indicate a surface brush, a brush arm, an arm for the holding pins, a semiconductor wafer and a chuck base, respectively.

As shown in FIG. 3A, the chuck base 47 is provided with the support pins 41 and the holding pins 42. The arm 45 is connected to the holding pins 42.

As shown in FIG. 3B, the semiconductor wafer 46 is first placed on the support pins 41. In doing so, the arm 45 is activated by an air cylinder to move the holding pins 42, so that the semiconductor wafer 46 is fixed. Since, at this time, the holding pins 42 have the first supporters 42A and the second supporters 42B respectively, the flexed semiconductor wafer 46 is kept in a horizontal position to start its cleaning.

According to the third embodiment as described above, since the flexion of a semiconductor wafer having a large diameter (e.g., 300 mm) is corrected by the configurations of holding pins, the entire surface of the semiconductor wafer is kept at the same height so that the semiconductor wafer can be cleaned uniformly.

Further, since the holding pins may be simply changed in structure, the present cleaning device is cheapest in cost. Since the cleaning device is simple in mechanism, less trouble is achieved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of cleaning a semiconductor wafer, comprising:
    supporting a semiconductor wafer from a lower surface thereof by a back brush which is substantially identical in surface area to the semiconductor wafer; and
    simultaneously cleaning the lower surface of said semiconductor wafer by the back brush and an upper surface thereof by a surface brush.

2. The method of cleaning a semiconductor wafer according to claim 1, wherein the semiconductor wafer is cleaned while the semiconductor wafer is kept in a substantially horizontal state by the back brush.

3. The method of cleaning a semiconductor wafer according to claim 1,
    wherein said back brush is rotated while the semiconductor wafer is cleaned.

4. A method of cleaning a semiconductor wafer, comprising:
    supporting a semiconductor wafer by a plurality of holding pins, each of which has a first supporter in contact with an upper surface of the semiconductor wafer and a second supporter in contact with a lower surface of the semiconductor wafer, a portion of the semiconductor wafer that is contacted by said second supporter being more inwardly disposed than a portion of the semiconductor wafer that is contacted by the first supporter; and
    cleaning the upper surface of the semiconductor wafer while supported by said holding pins.

5. The method according to claim 4, wherein said upper surface of the semiconductor wafer is cleaned by a brush.

6. A method of cleaning a semiconductor wafer, comprising:
    chucking a semiconductor wafer on a purge chamber which is filled with fluid; and
    cleaning an upper surface of the semiconductor wafer using a brush while supporting a lower surface of the semiconductor wafer using a pressure of the fluid.

7. The method according to claim 6, wherein said semiconductor wafer is chucked by a vacuum chuck.

8. The method according to claim 6, wherein a pressure applied to the upper surface of the semiconductor wafer by the brush is substantially equal to the pressure applied to the lower surface of the semiconductor wafer by the fluid.

9. The method according to claim 6, further comprising cleaning a lower surface of the semiconductor wafer using the fluid.

10. The method according to claim 6, wherein said fluid is gas or liquid.

11. The method according to claim 6, wherein said fluid is sulfuric acid.

12. The method according to claim 6, wherein said fluid is ammonifying water.

13. The method according to claim 6, wherein said fluid is water including a surface-active ingredient.

* * * * *